United States Patent [19]

Enloe et al.

[11] Patent Number: 5,211,786
[45] Date of Patent: May 18, 1993

[54] USE OF PERMEABLE MATERIALS TO IMPROVE HOT PRESSING PROCESS

[75] Inventors: Jack H. Enloe, Columbia; John W. Lau, Gaithersburg, both of Md.

[73] Assignee: W. R. Grace & Co.-Conn., New York, N.Y.

[21] Appl. No.: 631,577

[22] Filed: Dec. 21, 1990

[51] Int. Cl.$^5$ .................... C04B 37/00; B28B 1/26; B29C 67/00
[52] U.S. Cl. ........................................ 156/89; 264/86; 264/125; 264/338
[58] Field of Search ............... 156/89; 264/58, 60, 264/61, 65, 57, 86, 125, 338

[56] References Cited

U.S. PATENT DOCUMENTS

| | | | |
|---|---|---|---|
| 4,340,436 | 7/1982 | Dubetsky et al. | 156/89 |
| 4,753,694 | 6/1988 | Herron et al. | 156/89 |
| 4,879,156 | 11/1989 | Herron et al. | 428/137 |
| 4,920,640 | 5/1990 | Enloe et al. | 29/852 |

FOREIGN PATENT DOCUMENTS 0243858 11/1987 European Pat. Off. .

Primary Examiner—Jan H. Silbaugh
Assistant Examiner—Christopher A. Fiorilla
Attorney, Agent, or Firm—Steven Capella

[57] ABSTRACT

The present invention overcomes the problems caused by certain intergranular phases present during hot pressing. The invention provides a method of removing such problematic intergranular phases while avoiding problems of non-uniformity. In one aspect, the invention encompasses an improvement in a method of sintering a green body by hot pressing, where the green body contains ceramic grains to be sintered and material capable of existing as intergranular phase material during sintering. The improvement embraces hot pressing the body in the presence of a permeable material adapted to receive at least a portion of intergranular phase material as the sintering takes place or after the sintering has been completed.

18 Claims, 4 Drawing Sheets

AlN Hot Pressed with Dense Graphite

AlN Hot Pressed with Permeable Graphite

USE OF PERMEABLE MATERIALS TO IMPROVE HOT PRESSING PROCESS

The invention was made with Government support under Contract No. N66001-88-C-0181 awarded by Naval Ocean Systems Center, Department of the Navy. The Government has certain rights in the invention.

FIELD OF THE INVENTION

This invention relates to tooling used in hot pressing, hot pressing techniques and techniques for hot pressing green ceramic substrates.

BACKGROUND OF THE INVENTION

Hot pressing is a technique for densifying green powder compacts or preforms using a combination of heat and pressure.

Hot pressing has principally been used to make parts having little volumetric detail. Such parts include plates, cylinders, simple straight tubes and the like. Many hot pressing applications have been directed to forming structural ceramic parts such as armor plates or wear parts. Such structural ceramic pieces do not usually have any surface or internal compositional features apart from, perhaps, a uniformly distributed composite phase.

A recent application of hot pressing technology has been in the area of ceramic substrates and electronic packaging for integrated circuit devices. U.S. Pat. No. 4,920,640 is a pioneer patent in this field. The contents of that patent are incorporated by reference in this application. The '640 patent discloses the use of hot pressing to form unmetallized and metallized single layer substrates and multilayer laminated substrates containing various configurations of metallization.

Another application of hot pressing was made in U.S. Pat. No. 4,753,694 to Herron et al. In Herron et al., a preformed laminate of metallization and glass-ceramic particles was densified to form a multilayered substrate at less than 1000° C. In Herron et al., the preformed laminate was placed directly between two porous alumina platens which exerted pressure on the preform to prevent lateral shrinkage.

In a typical hot pressing process, the body to be sintered may contain ceramic particles to be sintered, a binder, and possibly a sintering aid. The binder is typically an organic binder which is removed by combustion or pyrolysis before sintering. As the ceramic sinters during hot pressing, intergranular phase material often forms. This material may result from the sintering aid additions and/or from impurities present in the starting ceramic particles. The presence of intergranular phase is usually desirable as it assists the sintering process.

For sintering ceramic particles, hot pressing conditions typically involve temperatures in excess of 1000° C., usually in excess of 1200° C. These temperatures are combined with varying degrees of pressure to enhance and/or accelerate the sintering process.

While intergranular phases are generally desirable to assist sintering, the behavior of some of these phases can be detrimental to the sintered product. Certain liquid phases tend to wet the ceramic grain boundaries. If those phases remain after sintering, the high temperature mechanical properties of the sintered product may be degraded. For example, such wetting phases may promote grain sliding or other phenomena which contribute to high temperature creep.

Additionally, since the wetting phase represents a microstructural inhomogeneity between grains, the wetting phase may affect other properties as well (e.g., it may lower the effective thermal conductivity of the body).

Thus, for some materials systems, it may be desirable to hot press under conditions so liquid phase sintering occurs, but the liquid phase is eventually removed by evaporation from the grain boundary surface to improve material properties. Such methods of hot pressing and liquid phase removal present additional problems. Namely, since hot press tooling encloses the ceramic part, uniform removal of the liquid phase from the part is often difficult or impossible to achieve. Non-uniform liquid phase removal can cause non-uniformity of properties in the sintered product.

Thus, there is a need for an improved hot pressing technique which allows use of intergranular phase material during sintering while avoiding the problems caused by certain intergranular phases.

SUMMARY OF THE INVENTION

The present invention overcomes the problems caused by certain intergranular phases present during hot pressing. The invention provides a method of removing such problematic intergranular phases while avoiding problems of non-uniformity.

In this disclosure, the term "green body" is meant to include a) bodies formed into a shape before being placed into the die (i.e., preforms) and b) bodies formed by pouring powder into the die and molding it in situ.

In one aspect, the invention encompasses an improvement in a method of sintering a green body by hot pressing, where the green body contains ceramic grains to be sintered and material capable of existing as intergranular phase material during sintering. The improvement embraces hot pressing the body in the presence of a permeable material adapted to receive at least a portion of intergranular phase material as the sintering takes place or after the sintering has been completed.

In a further aspect, the invention embraces a method of hot pressing a preformed shape, the shape containing ceramic grains to be sintered and material capable of existing as intergranular phase material during sintering, the method including:

(a) placing the shape into a die;
(b) placing tooling into the die about the shape, wherein
   (i) the tooling is adapted to hold the shape in said die,
   (ii) at least a portion of the tooling is adapted to transfer pressure to the shape, and
   (iii) at least a portion of the tooling is permeable to liquid and/or vapor forms heating of the intergranular phase material;
(c) the shape to start sintering; and the sintering shape to
(d) applying pressure to accelerate and/or induce further sintering whereby the sintering is completed and at least a portion of the intergranular phase material is transferred from the shape to the permeable tooling.

In a further aspect, the invention encompasses tooling for hot pressing shapes, the tooling comprising a die for containing the shapes and a ram which fits into the die, wherein the tooling has at least a portion thereof containing a material permeable to intergranular phase material present in said shapes during hot pressing.

Preferably, the permeable portion of the tooling includes a rigid member adapted to transfer pressure to the shape. In a further more specific aspect, the permeable material is preferably a permeable graphite material.

DETAILED DESCRIPTION

Figure 1:
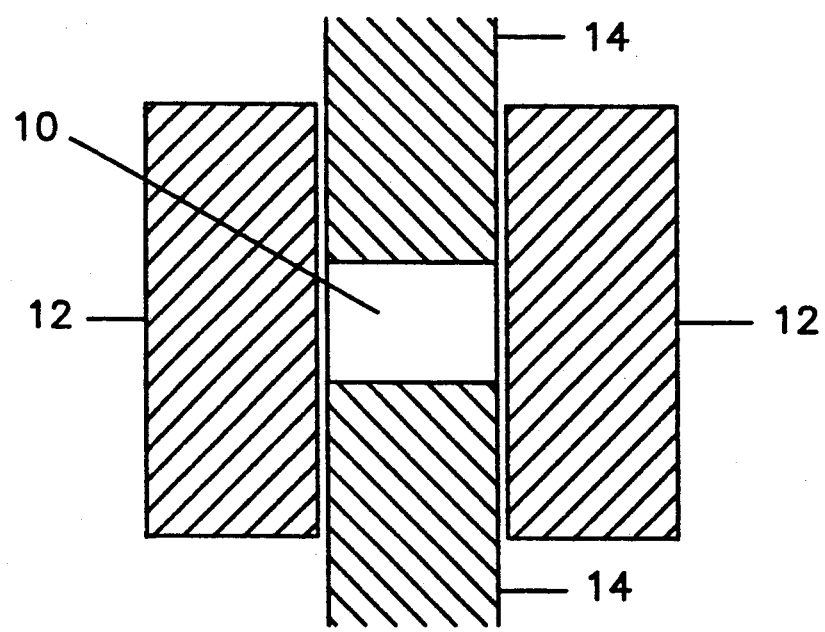
FIG. 1 shows a cross-section of a typical prior art hot press tooling for pressing a single piece.

A typical hot press tooling configuration of the prior art is shown in FIG. 1. This tooling consists of a die 12 into which a ceramic powder or preform 10 is placed. The rams 14 are inserted into the top and bottom ends of die 12 to exert pressure on the ceramic 10. In the prior art, the tooling used in such a configuration was usually dense graphite.

Figure 2:
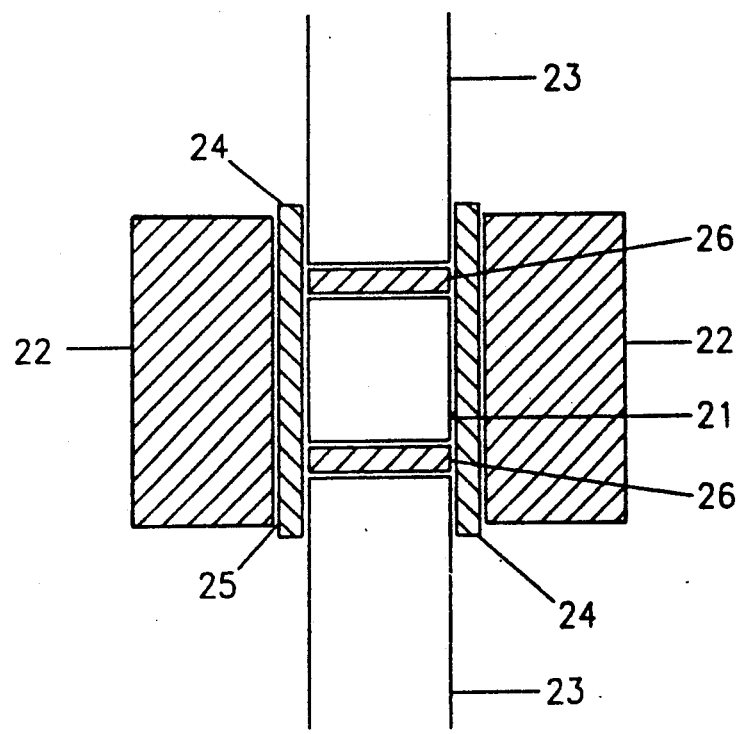
FIG. 2 shows a cross-section of a hot press tooling embodiment of the invention for pressing a single piece.

A preferred tooling setup for a hot pressing apparatus is illustrated in FIG. 2. The body (or powder) 21 to be hot pressed is placed in a die 22. Rams 23 are located above and below body 21. Rams 23 are used to apply pressure to body 21 during hot pressing. Spacers 26 ma be placed between rams 23 and body 21. Shims 24 are placed between body 21 and die wall 25. Shims 24 are usually adapted to fit snugly between die wall 25 and body 21 to prevent outward lateral movement or deformation of body 21. Additional shims would also be present between the front and back edges of body 21 and die wall 25. These additional shims are not shown in FIG. 2.

Die wall 25 may be of any desired shape so long as body 21 can be accommodated therein. The die 22 is typically a monolith. The shims 24 are adapted to conform to the shape of die wall 25 and the edges of body 21. An intermediary material (not shown) may be placed between body 21 and spacers 26.

Figure 3:
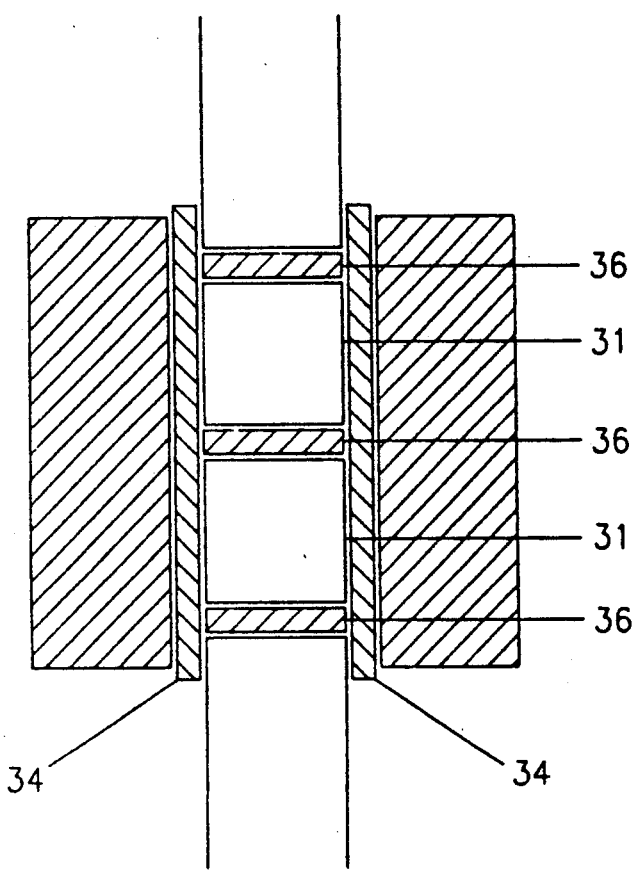
FIG. 3 shows a cross-section of hot press tooling embodiment of the invention for pressing multiple pieces simultaneously.

FIG. 3 shows an alternate tooling arrangement for simultaneously pressing multiple bodies 31. In this case, spacers 36 are placed between bodies 31. Intermediary material (not shown) may be placed between spacers 36 and bodies 31.

The tooling used in hot pressing operations is often made of dense graphites having low thermal expansion coefficients (e.g., Union Carbide's ATJ graphite). Dense graphite can easily withstand the temperatures used in most hot pressing operations. Additionally, dense graphite is strong, thus providing excellent transfer of pressure to the material to be hot pressed. Such dense graphites generally have very low permeability to phases present as intergranular phase material during sintering.

The invention will be discussed with respect to the tooling arrangements in FIGS. 2 and 3 merely for purposes of illustrating the invention. The invention itself is not limited to any particular tooling arrangement or any particular system of materials for the tooling or the body or preform to be sintered.

A principal feature of the invention is that the sintering (that takes place during the hot pressing) be performed in the presence of a permeable material adapted to receive intergranular phase. In this way, at least, a portion of intergranular phase is transferred to the permeable material. Once the intergranular phase is received by the permeable material, it may be absorbed and/or transferred by the permeable material.

While it is not really necessary that the permeable material be present during the entire sintering process, such an arrangement is generally more convenient. Also, the permeable material need not be in direct physical contact with the piece being sintered so long as it can still perform its function.

It is generally desirable that the permeable material be located about the entire ceramic body so as to promote a more uniform transfer of the liquid phase out of body. For the tooling configurations in FIGS. 2 and 3, it is preferred that the shims and spacers are made with permeable material.

It is also generally desirable that one or more exit paths be provided whereby some or all of the material received by the permeable material may be transferred out of the tooling. In cases where a large amount of permeable material is used relative to the amount of intergranular phase to be removed from the ceramic body, such exit paths may be omitted. In the embodiments shown in FIGS. 2 and 3, shims 24, 34 provide exit paths for transfer of the received intergranular phase. In other configurations, cracks between pieces of the tooling may serve as exit paths.

In many hot pressing applications, it may be desirable to place an intermediary material between the body to be sintered and the tooling. Such an intermediary material may assist in separation of the sintered body from the tooling and/or prevent undesired interactions between the tooling and the body. If such an intermediary material is used between the permeable material and the body, the intermediary material is preferably capable of allowing transmission of intergranular phase material from the body to the permeable material.

The relative quantity of permeable material present may vary, for example, according to the capacity to receive the material as well as the amount of intergranular phase to be removed. The geometric configuration of the tooling and the body or bodies to be sintered may also be a factor in determining the relative amount of permeable material used.

The permeable material used may be any permeable material capable of performing the receiving function under the selected hot pressing conditions. Additionally, the selected permeable material must also have sufficient strength to withstand mechanical stresses it may undergo during the hot pressing.

An additional consideration in the selection of the permeable material used is its thermal expansion coefficient (TCE). It is generally preferable that the TCE for the permeable material be less than that for the ceramic to be sintered. Additionally, the TCE of the permeable material is preferably equal to or only slightly different from that of the other parts of the tooling. If the permeable material does not possess this thermal expansion characteristic, then there may be a risk of fracture of the sintered body and/or the tooling during heating or cooling steps of the hot pressing process. Also, a permeable material having poor thermal expansion properties may place severe limitations on the geometric configurations of tooling that can be used.

A preferred permeable material for such hot pressing conditions is permeable graphite. Permeable graphite, such as HLM-50 graphite sold by Great Lakes Carbon, generally has a lower TCE compared to most ceramics. The degree of permeability desired may vary with the amount of intergranular phase to be removed, the desired rate of removal, the geometry of the tooling configuration, and the relative amount of permeable material present as well as other factors. If the permeable material is to be stressed during the hot pressing, then strength may also be a factor in determining the degree of permeability in the graphite or other material selected.

A fortuitous advantage to using permeable graphite (or other suitably strong permeable material) as the permeable material is that such permeable graphite may be used as a rigid member in the tooling (e.g., as a spacer or a shim). Thus, the permeable graphite may be used in place of conventionally used, typically more expensive, impermeable dense graphite.

A specific application of the invention is in the context of hot pressing substrates for electronic packages. The use of permeable materials allows for uniform removal of intergranular phases and thereby results in a substrate having more uniform properties and improved overall properties.

While this application of the invention is described with respect to aluminum nitride-based substrates, it should be understood that the invention is not limited to aluminum nitride ceramics, to hot pressing aluminum nitride substrates or to electronic packaging.

Referring to U.S. Pat. No. 4,920,640, an aluminum nitride preform may be formed by forming a layer or a lamination of several layers of green tapes which contain aluminum nitride particles, a binder, and perhaps, a sintering aid. Any or all of the layers may carry metallization which is applied by some known technique.

The preform is then preferably placed between layers of a suitable intermediary material (e.g., a boron nitride tape) to protect the preform from the tooling. Intermediary materials can be omitted if there is no concern regarding interaction between the tooling and the preform. The intermediary material should be selected so that it does not undesirably inhibit the performance of the permeable material used.

Boron nitride is a preferred intermediary material. It is also preferable that the intermediary material be applied in tape form so as to ensure a more uniform thickness of intermediary material across the preform.

The preform is placed into the die and surrounded by components of the tooling, namely, the spacers and shims. If more than one preform is to be simultaneously pressed, then the tooling would also include spacers to be placed between the preforms.

Preferably, the shims and spacers are all made of permeable material adapted to receive intergranular phase material during the hot pressing. A preferred permeable material is permeable graphite sold by Great Lakes Carbon under the name HLM-50. This material has a permeability of about 0.06–0.20 Darcy. Generally, the permeable material preferably has a permeability of at least about 0.01 Darcy.

The rate and degree of removal of intergranular material also generally depend on the selected hot pressing conditions, especially temperature, time, and pressure. Higher temperatures usually promote faster transfer of intergranular phase out of the body. Longer times at temperature promote a greater degree of intergranular phase removal. Higher temperature is believed to increase the mobility of the intergranular phase. For the AlN system using BN tape and permeable graphite, the maximum hot pressing temperature used is preferably about 1800°–1850° C.

Increased pressure does not appear to have a great direct effect on the mobility of the intergranular phase material. Increased pressure can have an adverse effect on the permeability of the permeable material used. Additionally, increased pressure may adversely effect the intermediary material. For the AlN system using BN tape and permeable graphite, pressures between about 300 and 800 PSI are preferred.

The following examples illustrate embodiments of the invention. The invention is not limited to the examples or the materials discussed therein.

EXAMPLE

Two metallized, multi-layer aluminum nitride preforms were prepared in accordance with the method described in Example 3 of U.S. Pat. No. 4,920,640 using the green sheet compositions described therein. The metallized preforms were laminated between BN sheets.

Each of metallized preforms was individually hot pressed. The first preform was hot pressed using dense graphite tooling in the configuration shown in FIG. 1. The second preform was hot pressed using the tooling configuration shown in FIG. 2. Permeable graphite (HLM-50) was used as the material for the shims and spacers for hot pressing the second preform. The preforms were treated under the following conditions:

A) heating to about 600° C. in vacuum with no pressure and holding at that temperature to allow binder evolution; and B) heating to a maximum hot pressing temperature of 1800°–1850° C. at 1000 PSI in a nitrogen atmosphere and holding there for four hours.

Figure 4A:
FIGS. 4A and 4B show comparison photographs of substrates hot pressed with only dense graphite tooling versus tooling having permeable graphite.
Figure 4B:
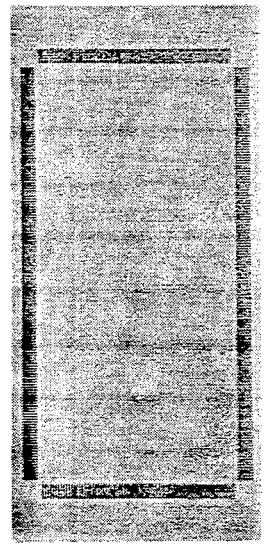

After hot pressing, the sintered substrates were removed from the die and grit blasted to remove any remaining portion of the BN material. The resultant substrates are shown in FIGS. 4A and 4B. The substrate hot pressed with permeable graphite is uniformly translucent indicating an absence of undesirable intergranular material. The substrate hot pressed with dense graphite is dark and opaque indicating the presence of undesirable intergranular phases.

What is claimed is:

1. In a method of sintering a green body by hot pressing wherein said green body contains ceramic grains to be sintered and material capable of existing as an intergranular phase material during said sintering, the improvement comprising hot pressing said body in the presence of a permeable graphite material adapted to receive t least a portion of said intergranular phase material whereby at least a portion of said intergranular material is received by said permeable graphite material as said sintering takes place.

2. The improvement of claim 1 wherein said permeable material has a permeability of about 0.06–0.20 Darcy.

3. The improvement of claim 1 wherein at least a portion of said permeable material is adapted to apply pressure to said green body.

4. The improvement of claim 3 wherein an intermediary material is placed between said green body and said portion adapted to apply pressure to said green body.

5. The improvement of claim 4 wherein said intermediary material is in the form of a layer.

6. The improvement of claim 5 wherein said layer contains boron nitride.

7. The improvement of claim 1 wherein at least a portion of the permeable material is in the form of a rigid member.

8. The improvement of claim 7 wherein at least a portion of said permeable material is a shim adapted to maintain said body in place relative to walls of a die in which said body is hot pressed.

9. The improvement of claim 7 wherein said rigid member is a spacer adapted to transfer pressure to said body.

10. The improvement of claim 1 wherein a plurality of green bodies are hot pressed simultaneously and at least a portion of said permeable material is a spacer placed between said bodies.

11. The improvement of claim 1 wherein said green body includes a laminate of green ceramic layers, each layer containing ceramic particles to be sintered and a binder.

12. The improvement of claim 11 wherein one or more of said layers also carries metallization.

13. The improvement of claim 12 further comprising removing the binder from said green layers prior to said start of sintering.

14. The improvement of claim 13 further comprising placing an intermediary material between said laminate and at least a portion of said permeable material prior to removing the binder.

15. The improvement of claim 14 wherein said intermediary material includes boron nitride.

16. The improvement of claim 15 wherein said ceramic particles include aluminum nitride.

17. The improvement of claim 16 wherein said green ceramic layers contain a sintering aid.

18. The improvement of claim 17 wherein said intergranular material received by said permeable material includes at least a portion of said sintering aid.

* * * * *